(12) United States Patent
Wootton et al.

(10) Patent No.: US 10,072,942 B2
(45) Date of Patent: Sep. 11, 2018

(54) ELECTRICAL MONITORING AND NETWORK ENABLED ELECTRICAL FACEPLATE

(71) Applicant: Ivani, LLC, Dardenne Prairie, MO (US)

(72) Inventors: Matthew Wootton, O'Fallon, MO (US); Justin McKinney, Wildwood, MO (US); Michael Crowell-Ingram, Santa Cruz, CA (US); Evan Dorsky, Avon, CT (US); Saarth Mehrotra, Appleton, WI (US); Erin Pierce, Needham, MA (US); Victoria Preston, Edgewater, MD (US); Jonathan Clark, St. Louis, MO (US); Zhen Wei, St. Louis, MO (US)

(73) Assignee: Ivani, LLC, Dardenne Prairie, MO (US)

( * ) Notice: Subject to any disclaimer, the term of this patent is extended or adjusted under 35 U.S.C. 154(b) by 0 days.

(21) Appl. No.: 15/449,172

(22) Filed: Mar. 3, 2017

(65) Prior Publication Data

US 2017/0322049 A1    Nov. 9, 2017

Related U.S. Application Data

(60) Provisional application No. 62/331,220, filed on May 3, 2016.

(51) Int. Cl.
*G01N 27/72* (2006.01)
*G01D 4/00* (2006.01)
(Continued)

(52) U.S. Cl.
CPC ............ *G01D 4/006* (2013.01); *G01J 1/4204* (2013.01); *G01K 13/00* (2013.01); *G01R 11/04* (2013.01); *G01R 19/15* (2013.01); *H04W 84/18* (2013.01)

(58) Field of Classification Search
None
See application file for complete search history.

(56) References Cited

U.S. PATENT DOCUMENTS

| | | | | |
|---|---|---|---|---|
| 3,813,579 A | * | 5/1974 | Doyle | H01H 71/505 335/18 |
| 8,193,929 B1 | * | 6/2012 | Siu | H04L 12/2829 340/538 |

(Continued)

FOREIGN PATENT DOCUMENTS

CN          1909755 A      2/2007

OTHER PUBLICATIONS

Using Encryption: Bluetooth Technology, http://www.brighthub.com/computing/smb-security/articles/106638.aspx, Feb. 15, 2011.*

(Continued)

*Primary Examiner* — Patrick Assouad
*Assistant Examiner* — Demetrius Pretlow
(74) *Attorney, Agent, or Firm* — Lewis Rice LLC (57) ABSTRACT

Systems and methods for environmental monitoring of high activity facilities, generally comprising low profile devices having sensing elements for various environmental uses, designed to provide the wireless communications network as a basis for performing a wide variety of tasks. The devices may be installed on an existing electrical system and may measure, among other things, electrical current on various circuits.

9 Claims, 6 Drawing Sheets

(51) Int. Cl.
*G01J 1/42* (2006.01)
*G01K 13/00* (2006.01)
*G01R 11/04* (2006.01)
*G01R 19/15* (2006.01)
*H04W 84/18* (2009.01)

(56) References Cited

U.S. PATENT DOCUMENTS

| | | |
|---|---|---|
| 8,269,376 B1 | 9/2012 | Elberbaum |
| 8,536,998 B1 | 9/2013 | Siu et al. |
| 9,575,091 B2* | 2/2017 | Reeder, III ........... G01R 1/0408 |
| 2006/0161270 A1 | 7/2006 | Luskin et al. |
| 2009/0174569 A1 | 7/2009 | Smith et al. |
| 2010/0070217 A1* | 3/2010 | Shimada ................ G01D 4/008 |
| | | 702/62 |
| 2011/0082599 A1* | 4/2011 | Shinde ................ H02J 13/0003 |
| | | 700/295 |
| 2011/0109301 A1 | 5/2011 | Johnson et al. |
| 2011/0304205 A1 | 12/2011 | Lee |
| 2012/0049639 A1* | 3/2012 | Besore .................. G01K 3/005 |
| | | 307/97 |
| 2012/0280822 A1* | 11/2012 | Kuo ....................... G01R 15/20 |
| | | 340/664 |
| 2014/0097758 A1 | 4/2014 | Recker et al. |
| 2014/0117780 A1* | 5/2014 | Buchheim ............. G01D 4/006 |
| | | 307/126 |
| 2014/0117871 A1 | 5/2014 | Swatsky et al. |
| 2014/0266171 A1* | 9/2014 | Mosser ................ G01R 15/207 |
| | | 324/228 |
| 2015/0022181 A1* | 1/2015 | Anderson ................ H04Q 9/00 |
| | | 324/114 |
| 2015/0088331 A1* | 3/2015 | Fiedler ..................... G05F 1/66 |
| | | 700/295 |

OTHER PUBLICATIONS

International Search Report, International Patent Application No. PCT/US2017/030864, dated Jul. 28, 2017 (13 pages).
Extended European Search Report, International Patent Application No. EP15857698, dated Jun. 5, 2018 (12 pages).

* cited by examiner

ELECTRICAL MONITORING AND NETWORK ENABLED ELECTRICAL FACEPLATE

CROSS-REFERENCE TO RELATED APPLICATIONS

This application claims benefit of U.S. Provisional Patent Application No. 62/331,220, filed May 3, 2016, the entire disclosure of which is herein incorporated by reference.

BACKGROUND OF THE INVENTION

Field of the Invention

This disclosure is related to the field of unobtrusive monitoring and installation of monitoring systems. In particular, the systems and methods described herein provide a monitor in the form of a faceplate for installation on an electrical outlet, which can be used for asset tracking and power consumption monitoring.

Description of the Related Art

Connected technologies are typically sensor instruments that are augmented with wireless communication devices which communicate with a local network. This local network can be queried so that information from sensor output can be transmitted and aggregated into a single location. Two types of sensor instrumentation which are currently gaining in popularity are those for power monitoring and for asset tracking.

Connected technologies are becoming quite popular in the home consumer market. For example, there are a plethora of devices that will monitor everything from how much power a lamp is using, to helping you to locate your car keys, to allowing you to remotely control your home lighting, to having your HVAC system determine if it needs to operate. These systems all generally operate along a similar principle. A monitor is generally attached to the system to be monitored (e.g. the lamp, car keys, light outlet, or thermostat) which provides for sensors for detecting of the operation of the attached object and related criteria (such as environmental conditions). The monitor has communication capability, generally to communicate to a wireless network, and the monitor then operates based on a central control (either in an automated fashion or through manual control). The network used by the monitors is commonly a user's home wireless network that they also use to allow for their computers to connect to external networks such as the Internet or may be through Bluetooth with a user's mobile devices.

In both home and industry settings, sensing technologies are increasingly installed to fulfill tasks such as measuring power consumption of devices that are connected to a centralized power source, or monitoring environmental factors which include but are not limited to, humidity, noise, temperature, radiation, and light levels. Further, some subset of these sensing devices are augmented with a wireless antennae and protocol in order to transmit information from said devices to a centralized computer for analysis and display to a human operator as this allows for the systems to monitor at disparate locations, while being reviewed at a central control. To be of value in locating points of loss, electrical use sensing systems generally have to monitor the electrical use of a single object connected to the electrical system, not just use as a whole. Thus, it is commonly the case that electrical use sensors are installed at every electrical using object, and these utilize a communications network to communicate their individual results to a central location. The installation of such sensors at every electrical using object with traditional systems can be both costly and highly invasive for a large enterprise.

Home technologies generally have yet to penetrate many industries and commercial establishments. Sectors like healthcare, in which the typical facilities of the sector (i.e. hospitals, clinics) can be classified as high-activity facilities with large numbers of assets to be monitored, can be problematic. Specifically, the lack of connected technology in such facilities is often driven by a couple of concerns. The first is the invasiveness of installing and expanding networks of devices within the physical building. Disruption of power systems for technology installation can cost more immediately than the long term gain the technology can offer. For example, a hospital generally cannot afford to shut off its electricity (even to a relatively small portion of the facility) without having to render that portion completely unusable for its primary task while the installation occurs. This can result in thousands of lost hours of work. A second problem is that the large number of assets to be monitored can make the number of needed sensors (assuming at least one needs to be provided to virtually every asset) cost prohibitive.

In households, common power monitoring techniques involve adding in-line sensing technology or centralized monitoring at breaker boxes. Though effective, these methods do not scale appropriately to high draw buildings in which such devices would be very costly and disruptive to install. In order to achieve appropriate positioning, massive and invasive installation within a facility has previously been necessary to place the physical nodes within the network, provide power to said nodes, and connect said nodes in a communications network. This process is time consuming, must be conducted by a trained technician, and requires at least part of the facility to disconnect electrical power.

In the commercial space, asset tracking services for high-activity facilities has begun to catch on in many commercial contexts using RFID tagging and related technologies. Commercially, this is used primarily for areas such as inventory control and high value asset location where the value of any individual tracked object is low, the need to locate it quickly provides great value, and the cost of installation is more easily justified. These systems generally comprise moving fiducial elements which are part of or with the asset being tracked, and a ground-truth network which requires many nodes to receive signals from the moving elements.

Tracking objects may be done using a number of techniques. Examples of some known systems include global positioning location systems such as GPS, which use orbiting satellites to communicate with terrestrial transceivers. While effective for monitoring high value assets such as company vehicles, GPS transceivers are expensive, power intensive, and are generally substantially less effective indoors as satellite signals may not achieve sufficient accuracy. As most commercial facilities are indoors, GPS technologies are generally not cost effective for asset tracking within facilities.

Instead, other technologies are often used for asset tracking indoors. These technologies include Radio Frequency Identification (RFID) tagging which utilizes specifically transmitted radio signals received by a specifically designed radio antenna, and iBeacon or Bluetooth® technologies, which calculate the location of a roaming or unknown transceiver using Bluetooth® or other wireless signals. Regardless of implementation, the roaming transceiver acts as a fiducial element while the "beacon" acts as a receiver of known location.

As the roaming transceiver moves through the space where it can transmit and/or receive from the beacons, the location of the roaming transceiver can be determined by the beacon system. The exact methodology used to determine location can vary from system to system and is often dependent on the nature of the tracking desired. For example, for many inventory control systems, the key piece of information is often simply which room in a facility an inventory item is located, not specifically where it is in the room. For these types of systems, the beacons can be mounted in access points such as doorways. The item tracking is performed by simply detecting that the item has passed through an access point (and possibly the direction it was moving). The item is then presumed to be in the final room whose doorway it was detected as entering, and where no doorway detected it leaving.

Figure 1:
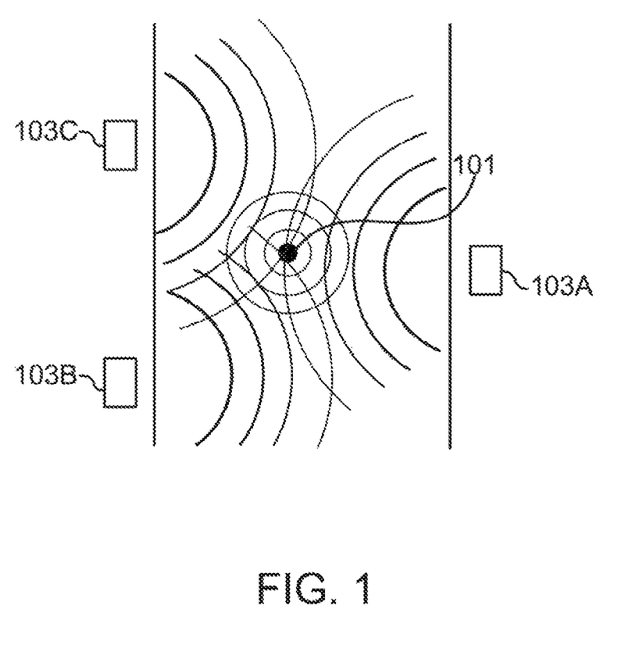
FIG. 1 provides an embodiment of a network configuration for detecting a mobile device with a plurality of static devices.

An alternative methodology is to effectively utilize triangulation of signals or another form of relative positioning relative to the known position(s) of static beacons. In this situation, the beacons are provided in a fashion that they will commonly have overlapping reception areas and static positioning. An example of this is shown in FIG. 1. In this scenario, as the mobile device (101) moves through the transmitting/receiving areas of the various beacons (103A), (103B) and (103C), which beacon it can communicate with and how strong the signal strength is to that beacon, can be used to locate the mobile transceiver relative to the position of the three beacons (103A), (103B), and (103C). As the beacons (103A), (103B), and (103C) are located in known fixed positions, this can be used to accurately determine the location of the mobile element (101).

As should be apparent, the layout of FIG. 1 can provide for a number of benefits over the access point detection discussed earlier. In particular, the embodiment of FIG. 1 allows for location of the mobile device (101) within a room to be determined. Further, the arrangement can eliminate errors where a mobile item (101) may have not "checked in" with a doorway that it passed for some reason as the system of FIG. 1 is effectively monitoring at all times and all places instead of just at a single target location. Thus, the embodiment of FIG. 1 is often substantially more accurate in its location determination. As such, it can be more valuable for the location of highly mobile assets that move repeatedly during the course of a single day, or those where specific location, and not just general location, needs to be known.

A problem with the layout of FIG. 1, however, is that a high density of beacons (103A), (103B), and (103C) is required to aggregate accurate and useful information about an environment from these systems. To really be accurate, the mobile element (101) needs to communicate with at least two and preferably three beacons at any and all times. Thus, the number of beacons that can be necessary to accurately be able to track objects throughout a large facility, such as a hospital, factory, or warehouse, can be substantial. Further, each of these beacons has traditionally had to be mounted or placed somewhere where it won't be in the way and won't be moved or damaged by standard activities, and it requires connection to a power source to power its activities which can result in disruption during installation.

While the power source connectivity can be simplified through the use of long lasting batteries or other internal power sources (such as solar cells in the right environment), in order to make sure that the beacon (103A), (103B), or (103C) is always functioning and has power, it is often necessary to wire the beacons (103A), (103B), and (103C) into the building's electrical system or install them near an existing electrical outlet to provide them with relatively uninterruptable power. In the latter case, the beacons (103A), (103B), and (103C) utilize the plug connections in an outlet preventing access to one or more of the outlets, thus reducing the number of items which may be plugged in at a given location. This can be a serious problem in facilities such as hospitals that rely on distributed power outlets throughout the facility for other purposes. Overall, all of these problems contributes to beacon systems involving an expensive and invasive installation process for each sensor which potentially includes disruption of main electrical power for safety reasons during installation. This presents many of the same problems as installation of power monitoring systems in those same facilities.

As should be apparent from the above, especially within high activity facilities, asset tracking and electrical power monitoring are two of the most invasive sensing systems to install as both generally require a large number of individual devices (beacons and electrical use sensors respectively), in addition to a special communications network establishment such as a W-Fi network that may be separate to both of them. Thus, while both technologies are clearly desirable for use with commercial facilities, difficulties in installation have led to relatively low adoption.

SUMMARY OF THE INVENTION

The following is a summary of the invention in order to provide a basic understanding of some aspects of the invention. This summary is not intended to identify key or critical elements of the invention or to delineate the scope of the invention. The sole purpose of this section is to present some concepts of the invention in a simplified form as a prelude to the more detailed description that is presented later.

Described herein, among other things, is a monitor device of a wireless networking monitoring system comprising: a faceplate having an outside surface and an opposing inside surface, and configured to install on a duplex outlet; a computer attached to the inside surface; an antenna attached to the inside surface; a transceiver coupled to the antenna attached to the inside surface and operatively coupled to the computer and configured to transmit and receive via the antenna; two electrically conductive protrusions attached to the inside surface, the two electrically conductive protrusions sized and shaped, and positioned on the surface, to contact and draw power from terminal posts of the duplex outlet when the faceplate is installed thereon, the electrically conductive protrusions providing the drawn power to the computer and to the transceiver.

In an embodiment, the monitor device further comprises: a magnetic field sensor attached to the inside surface, the magnetic field sensor disposed on the inside surface at a location configured to detect and measure magnetic fields.

In an embodiment, the duplex outlet magnetic field sensor is configured to measure current passing through the duplex outlet.

In an embodiment, the magnetic field sensor is coupled to the computer and the computer is configured to receive from the magnetic field sensor the measurements of the current passing through the duplex outlet.

In an embodiment, the duplex outlet comprises a plurality of outlets, and the computer is further configured to determine which of the plurality of outlets electrical current is flowing through.

In an embodiment, the magnetic field sensor is selected from a group consisting of: compass; magnetometer; search coil; flux-gate; optically pumped; nuclear precession; superconducting quantum interference device (SQUID); Hall-effect; magnetoresistive; magnetodiode; magnetotransistor; fiber optic; and magnetooptic.

In an embodiment, the transceiver is configured to transmits and receives via an encrypted protocol.

In an embodiment, the transceiver is configured to transmit at a carrier frequency of 850 MHz to 17.5 GHz, inclusive.

Also described herein, among other things, is a network monitoring system comprising: a first duplex outlet; a first monitor device installed on the first duplex outlet and comprising: a faceplate having an outside surface and an opposing inside surface, and configured to install on a duplex outlet; a computer attached to the inside surface; an antenna attached to the inside surface; a transceiver coupled to the antenna attached to the inside surface and operatively coupled to the computer and configured to transmit and receive via the antenna; two electrically conductive protrusions attached to the inside surface, the two electrically conductive protrusions sized and shaped, and positioned on the surface, to contact and draw power from terminal posts of the first duplex outlet when the faceplate is installed thereon, the electrically conductive protrusions providing the drawn power to the computer and to the transceiver; a magnetic field sensor attached to the inside surface, the magnetic field sensor disposed on the inside surface at a location configured to detect and measure magnetic fields generated by the power drawn through the outlet; a central computer server in wireless communication with the first monitor device via the transceiver; wherein the computer is configured to transmit to the central computer server the measurements of the current passing through the first duplex outlet received at the first monitor device from the magnetic field sensor.

In an embodiment, the system further comprises: a second duplex outlet; a second monitor device comprising: a faceplate having an outside surface and an opposing inside surface, and configured to install on a second duplex outlet; a computer attached to the inside surface; an antenna attached to the inside surface; a transceiver coupled to the antenna attached to the inside surface and operatively coupled to the computer and configured to transmit and receive via the antenna; two electrically conductive protrusions attached to the inside surface, the two electrically conductive protrusions sized and shaped, and positioned on the surface, to contact and draw power from terminal posts of the second duplex outlet when the faceplate is installed thereon, the electrically conductive protrusions providing the drawn power to the computer and to the wireless transceiver; and a magnetic field sensor attached to the inside surface, the magnetic field sensor disposed on the inside surface at a location configured to detect and measure magnetic fields generated by the power drawn through the outlet; wherein the second monitor device computer is configured to transmit to the central computer server the measurements of the current passing through the second duplex outlet received at the second monitor device from the second monitor device magnetic field sensor.

In an embodiment, the second monitor device computer is configured to wirelessly communicate with the first monitor device computer.

In an embodiment, the second monitor device computer is configured to wirelessly communicate with the central computer server.

In an embodiment, the wireless communications between the first monitor device and the second monitor device, and between the first monitor device and the central computer server, and between the second monitor device and the central computer server, are via a wireless telecommunications network.

In an embodiment, the central computer server is configured to determine a position of an entity physically disposed within the wireless telecommunications network, the determination based upon properties of communications in the wireless telecommunications network detected by the monitor device transceiver and transmitted to the central computer server.

In an embodiment, the central computer server is configured to determine a position of an tracking device physically disposed within the wireless telecommunications network and in communication with the first monitor device transceiver and with the second monitor device transceiver, the determination based upon properties of the communications between the tracking device and the first monitor device in the wireless telecommunications network, the properties detected by the first monitor device transceiver and transmitted to the central computer server.

In an embodiment, the first monitor device comprises at least one environmental sensor attached to the inside surface, the environmental sensor communicatively coupled to the first monitor device computer; wherein the first monitor device computer is configured to receive from the at least one environmental sensor data indicative of an environmental condition detected by the at least one environmental sensor; wherein the first monitor device computer is configured to transmit to the central computer server the environmental sensor data received at the first monitor device computer from the at least one environmental sensor.

In an embodiment, the at least one environmental sensor is selected from the group consisting of: a light sensor; a noise sensor; a temperature sensor; and a humidity sensor.

In an embodiment, the system further comprises a mobile device of a user in wireless communication with the central computer server, the mobile device configured to receive from central computer server, and display on a display of the mobile device, the data indicative of the environmental condition detected by the at least one environmental sensor.

In an embodiment, the mobile device is a mobile smart phone or a mobile computer.

In an embodiment, the magnetic field sensor of the first monitor device is configured to measure current passing through the first duplex outlet.

In an embodiment, the first outlet is wired in parallel with the second outlet, and current passing through the first outlet is determined at least in part based on readings of current passing through the second outlet.

In an embodiment, the magnetic field sensor of the first monitor device is coupled to the computer and the computer is configured to receive from the magnetic field sensor the measurements of the current passing through the first duplex outlet.

In an embodiment, the first duplex outlet comprises a plurality of outlets, and the first monitor device computer is further configured to determine which of the plurality of outlets electrical current is flowing through.

In an embodiment, the magnetic field sensor of the first monitor device is selected from a group consisting of: compass; magnetometer; search coil; flux-gate; optically pumped; nuclear precession; superconducting quantum interference device (SQUID); Hall-effect; magnetoresistive; magnetodiode; magnetotransistor; fiber optic; and magnetooptic.

In an embodiment, the first monitor device magnetic sensor collects magnetic field data about one or more magnetic fields near the duplex outlet; wherein the first monitor device computer is configured to transmit the collected magnetic field data to the central computer server; wherein the second monitor device magnetic sensor collects second magnetic field data about one or more magnetic fields near the second duplex outlet; wherein the second monitor device computer is configured to transmit the collected second magnetic field data to the central computer server.

In an embodiment, the first magnetic field data and the second magnetic field data comprise data about one or more of field strength and field direction.

In an embodiment, the first monitor device transceiver and second monitor device transceiver are configured to transmit and receive via an encrypted protocol.

In an embodiment, the first monitor device transceiver and second monitor device transceiver are configured to transmit at a carrier frequency of 850 MHz to 17.5 GHz, inclusive.

Also described herein, among other things, is a method comprising: providing a duplex outlet comprising a plurality of electrical outlets; providing a monitor device comprising: a faceplate having an outside surface and an opposing inside surface and installed on the duplex outlet; a computer attached to the inside surface; two electrically conductive protrusions attached to the inside surface, the two electrically conductive protrusions configured to contact and draw power from terminal posts of the duplex outlet when the faceplate is installed thereon, the electrically conductive protrusions providing the drawn power to the computer and to the transceiver; and a magnetic field sensor attached to the inside surface, the magnetic field sensor disposed on the inside surface at a location configured to detect and measure magnetic fields generated by the power drawn through said outlet; providing a central computer server; the magnetic field sensor detecting and measuring magnetic fields generated by the power drawn through the outlet; the computer determining an amount of current flowing through the duplex outlet, the determination based at least in part on the detected and measured magnetic fields; the computer determining which of the plurality of electrical outlets electrical current is flowing through, the determining based at least in part on the detected and measured magnetic fields; the monitor device further comprising a transceiver attached to the inside surface; the computer causing the transceiver to transmit to the central computer server the determined amount of electrical current, and the determined electrical outlet electrical current is flowing through.

Also described herein, among other things, is a computer-readable storage medium having program instructions thereon which, when executed by a microprocessor of a computer, cause the computer to perform the steps of: receive magnetic field data from a magnetic field sensor; calculate, based on the received magnetic field data, an amount of current flowing through a duplex outlet; determine, based on the received magnetic field data, which outlet of the duplex outlet current is flowing through; cause a transceiver to transmit the calculated amount of current and the determined outlet to a second computer.

DESCRIPTION OF THE PREFERRED EMBODIMENT(S)

The following detailed description and disclosure illustrates by way of example and not by way of limitation. This description will clearly enable one skilled in the art to make and use the disclosed systems and methods, and describes several embodiments, adaptations, variations, alternatives and uses of the disclosed systems and methods. As various changes could be made in the above constructions without departing from the scope of the disclosures, it is intended that all matter contained in the description or shown in the accompanying drawings shall be interpreted as illustrative and not in a limiting sense.

Combining capabilities for asset tracking and power monitoring into a mesh network enabled wireless device and non-invasive installation package could provide for a solution. The systems and methods described herein capitalize on the advances in sensing technology and wireless networking to provide for power monitoring and ground-truth field for an opt-in asset tracking system of moving fiducial elements in a high-activity facility by placing technology within a replacement faceplate for an electrical outlet. Installation of such a monitor can be done readily at already constructed facilities based upon the fact that construction of buildings to building codes generally provides for substantial outlet locations and can be done without requiring interruption of the electrical grid within the facility during the installation. That is, the systems can be installed without ever turning off the power. The various faceplates may include a special wireless protocol that allows for automatic and secure local network population for a plurality of monitors. This local network may be entirely self-contained and private until data is requested by a secure user on a global network, in which case a virtual interface may be used to connect the local network securely to a global network for transmission of sensor and network data.

Generally speaking, described herein, among other things, are systems and methods for environmental and power consumption monitoring of high activity facilities. Generally speaking, the elements which make up such a system provide for low profile, easy to install devices with sensing elements for various environmental aspects, designed to provide the wireless communications network as a basis for performing a wide variety of tasks.

Throughout this disclosure, the term "computer" describes hardware which generally implements functionality provided by digital computing technology, particularly computing functionality associated with microprocessors. The term "computer" is not intended to be limited to any specific type of computing device, but it is intended to be inclusive of all computational devices including, but not limited to: processing devices, microprocessors, personal computers, desktop computers, laptop computers, workstations, terminals, servers, clients, portable computers, handheld computers, smart phones, tablet computers, mobile devices, server farms, hardware appliances, minicomputers, mainframe computers, video game consoles, handheld video game products, and wearable computing devices including but not limited to eyewear, wrist-wear, pendants, and clip-on devices.

As used herein, a "computer" is necessarily an abstraction of the functionality provided by a single computer device outfitted with the hardware and accessories typical of computers in a particular role. By way of example and not limitation, the term "computer" in reference to a laptop computer would be understood by one of ordinary skill in the art to include the functionality provided by pointer-based input devices, such as a mouse or track pad, whereas the term "computer" used in reference to an enterprise-class server would be understood by one of ordinary skill in the art to include the functionality provided by redundant systems, such as RAID drives and dual power supplies.

It is also well known to those of ordinary skill in the art that the functionality of a single computer may be distributed across a number of individual machines. This distribution may be functional, as where specific machines perform specific tasks; or, balanced, as where each machine is capable of performing most or all functions of any other machine and is assigned tasks based on its available resources at a point in time. Thus, the term "computer" as used herein, can refer to a single, standalone, self-contained device or to a plurality of machines working together or independently, including without limitation: a network server farm, "cloud" computing system, software-as-a-service, or other distributed or collaborative computer networks.

Those of ordinary skill in the art also appreciate that some devices which are not conventionally thought of as "computers" nevertheless exhibit the characteristics of a "computer" in certain contexts. Where such a device is performing the functions of a "computer" as described herein, the term "computer" includes such devices to that extent. Devices of this type include but are not limited to: network hardware, print servers, file servers, NAS and SAN, load balancers, and any other hardware capable of interacting with the systems and methods described herein in the matter of a conventional "computer."

Throughout this disclosure, the term "software" refers to code objects, program logic, command structures, data structures and definitions, source code, executable and/or binary files, machine code, object code, compiled libraries, implementations, algorithms, libraries, or any instruction or set of instructions capable of being executed by a computer processor, or capable of being converted into a form capable of being executed by a computer processor, including without limitation virtual processors, or by the use of run-time environments, virtual machines, and/or interpreters. Those of ordinary skill in the art recognize that software can be wired or embedded into hardware, including without limitation onto a microchip, and still be considered "software" within the meaning of this disclosure. For purposes of this disclosure, software includes without limitation: instructions stored or storable in RAM, ROM, flash memory BIOS, CMOS, mother and daughter board circuitry, hardware controllers, USB controllers or hosts, peripheral devices and controllers, video cards, audio controllers, network cards, Bluetooth® and other wireless communication devices, virtual memory, storage devices and associated controllers, firmware, and device drivers. The systems and methods described here are contemplated to use computers and computer software typically stored in a computer- or machine-readable storage medium or memory.

Throughout this disclosure, terms used herein to describe or reference media holding software, including without limitation terms such as "media," "storage media," and "memory," may include or exclude transitory media such as signals and carrier waves.

Throughout this disclosure, the term "network" generally refers to a voice, data, or other telecommunications network over which computers communicate with each other. The term "server" generally refers to a computer providing a service over a network, and a "client" generally refers to a computer accessing or using a service provided by a server over a network. Those having ordinary skill in the art will appreciate that the terms "server" and "client" may refer to hardware, software, and/or a combination of hardware and software, depending on context. Those having ordinary skill in the art will further appreciate that the terms "server" and "client" may refer to endpoints of a network communication or network connection, including but not necessarily limited to a network socket connection. Those having ordinary skill in the art will further appreciate that a "server" may comprise a plurality of software and/or hardware servers delivering a service or set of services. Those having ordinary skill in the art will further appreciate that the term "host" may, in noun form, refer to an endpoint of a network communication or network (e.g., "a remote host"), or may, in verb form, refer to a server providing a service over a network ("hosts a website"), or an access point for a service over a network.

Throughout this disclosure, the term "real time" refers to software operating within operational deadlines for a given event to commence or complete, or for a given module, software, or system to respond, and generally invokes that the response or performance time is, in ordinary user perception and considered the technological context, effectively generally contemporaneous with a reference event. Those of ordinary skill in the art understand that "real time" does not literally mean the system processes input and/or responds instantaneously, but rather that the system processes and/or responds rapidly enough that the processing or response time is within the general human perception of the passage of real time in the operational context of the program. Those of ordinary skill in the art understand that, where the operational context is a graphical user interface, "real time" normally implies a response time of no more than one second of actual time, with milliseconds or microseconds being preferable. However, those of ordinary skill in the art also understand that, under other operational contexts, a system operating in "real time" may exhibit delays longer than one second, particularly where network operations are involved.

Throughout this disclosure, the term "transmitter" refers to equipment, or a set of equipment, having the hardware, circuitry, and/or software to generate and transmit electromagnetic waves carrying messages, signals, data, or other information. A transmitter may also comprise the componentry to receive electric signals containing such messages, signals, data, or other information, and convert them to such electromagnetic waves. The term "receiver" refers to equipment, or a set of equipment, having the hardware, circuitry, and/or software to receive such transmitted electromagnetic waves and convert them into signals, usually electrical, from which the message, signal, data, or other information may be extracted. The term "transceiver" generally refers to a device or system that comprises both a transmitter and receiver, such as, but not necessarily limited to, a two-way radio, or wireless networking router or access point. For purposes of this disclosure, all three terms should be understood as interchangeable unless otherwise indicated; for example, the term "transmitter" should be understood to imply the presence of a receiver, and the term "receiver" should be understood to imply the presence of a transmitter.

Throughout this disclosure, the term "node" refers to a start point or endpoint for a network communication, generally a device having a wireless transceiver and being a part of a detection network. Nodes are generally standalone, self-contained networking devices, such as wireless routers, wireless access points, short-range beacons, and so forth. A node may be a general-purpose device or a special-purpose device configured for use in a detection network as described herein. By way of example and not limitation, a node may be a device having the wireless transmission capabilities of an off-the-shelf wireless networking device with the addition of specialized hardware, circuitry, componentry, or programming for implementing the systems and methods described herein; that is, for detecting significant changes to signal properties, including but not limited to, signal strength, bit error rate, and message delay. Within a detection network, each node can act as both a transmitter of signal to the network, as well as a receiver for other nodes to push information. This disclosure will typically refer to nodes as "beacons" which are intended to be nodes located in a static position, or as "mobile devices" which are intended to be of non-fixed location. Generally, one or more beacons will be used to provide the location or other characteristics of one or more mobile devices.

Throughout this disclosure, the term "outlet" means a fixture on equipment or a structure configured to accepting an electric plug, or movable connector, attached to an electrically operated device's main cable, to connect the device to an energized electrical circuit. The term "plug" is sometimes erroneously used to refer to an outlet, but is properly understood in the industry as the connector attached to the device to be powered, and not to the outlet for accepting such a connector. In typical installations, an outlet is configured to accommodate two plugs, with each individual plug connection point being also referred to as an outlet and the multi-outlet structure referred to as a "duplex" outlet. For sake of clarity, the individual connection points on an outlet fixture will be referred to herein as a "socket." Thus, an "outlet" has one or more "sockets." A "duplex outlet" has two "sockets." The outlet is typically attached to the electrical circuit by attaching the lines of an electrical cable to corresponding terminals on the outlet body. The terminals may be in any number of configurations, with "posts" or "screws" being common, as they can be rotated into the outlet body to hold the electrical wire in place. However, other terminals are also known in the art, including, but not limited to, push-in terminals. The outlet is typically installed within a plastic or metal housing, which is in turn attached to a wall stud or other rigid structural element of the building or equipment. The outlet is then usually covered with a decorative faceplate.

The systems described herein are generally built around a low profile device meant for installation as a faceplate for a typical power outlet, with additional elements included as required to perform additional functions. Such a construction allows for the use of magnetic field monitoring to determine the quantity of electrical current flowing through said typical power outlet. In addition to providing current measurements, such a device further includes both a computer and transceiver element for collecting said information and transmitting it wirelessly throughout a network of such devices. Such devices may further share said information with external computer servers to further improve the utility of such systems.

Such monitors may be affixed to the outlet by the typical screw ports that may be found on the front face of the outlet, replacing the standard plastic or metal faceplate used on such outlet to hide the hole that the outlet makes in drywall or related wall coverings (which are generally not completely conforming to the shape of the outlet). Contained within or on the faceplate is a package of sensors and a wireless communication chip by which a plurality of devices can be connected into a private, local network over an implemented communication protocol. In an alternative embodiment, an existing network such as a Wi-Fi network may be used by the monitors, but this is generally not preferred.

The transceiver element communicably coupled with a computer in each device provides for wireless communication nodes within the network which can be used for a variety of applications. Utilizing the generally static nature of such nodes, it is possible to build functionality into such a system which may locate mobile transceivers configured to communicate with the static elements within the network as illustrated in FIG. 1. Thus, devices which are capable of communicating wirelessly with the fixed elements within the network would be capable of locating themselves within said network spatially. In alternative embodiments, it can be possible to locate certain masses within the network using the disturbance of the wireless communications between static nodes without requiring said masses to contain a wireless communication device outright such as is discussed in U.S. Pat. No. 9,474,042, the entire disclosure of which is herein incorporated by reference.

When adding additional monitors to the facility, each monitor preferentially first transmits its credentials in a known manner to the prior network. The network receives such a message and recognizes the presence of the new monitor on the network, simply requiring a human installer with access to the internal private network to accept the new device into the network. An established network may consist of several communication channels, over which status information, commands, and signals collected from the monitors can be transmitted. One skilled in the art of distributed computing may use such a communications network to create more dense data transmission packets through a process of information aggregation and packet design. The resultant network may further include an interface in which the local plurality of monitors may connect to a global network when securely queried by central computer. Information collected by the plurality of monitor may then be accessible via an encrypted virtual application.

As shown best in FIG. 2, each monitor (200), whose form may take the primary shape of a standard faceplate (201) for an electrical outlet, may include electrically conductive protrusions (211) which extend into the housing to serve as an electrical transmission interface in which metal contacts on these protrusions (211) will contact, and subsequently draw power from, the powered terminals on the existing outlet. The monitor (200) has been constructed in such a way that said electrically conductive protrusions (211) will generally pose no significant risk of creating electrical shorting conditions regardless of the orientation of the monitor (200) during installation and will not present substantial additional shock risk after installation.

The location of these protrusions (211) will generally mirror the expected design of screw terminal locations as per prevailing outlet and switch design standards. Due to this design, the protrusions (211) on the monitor will also intersect magnetic fields which propagate during power draw of a load attached to either individual socket of a duplex outlet. These fields can be subsequently measured by placing a magnetometer (207) or similar sensor somewhere along or sufficiently near one of these protrusions (211), particularly central to the active lines, and using a specialized algorithm to extract direction, phase, and magnitude of the magnetic field to infer the power draw of a load attached to the outlet.

Other magnetic sensors may also or alternatively be used. Such sensors may comprise, without limitation, search coil, flux-gate, optically pumped, nuclear precession, superconducting quantum interference device (SQUID), Hall-effect, magnetoresistive, magnetodiode, magnetotransistor, fiber optic, and magnetooptic.

Such algorithms may be specific for the operation of each monitor (200) to perform current (amperage) measurement. As should be apparent, installation of current measuring elements is greatly simplified compared with prior systems. Further, the intended analysis technique may allow for determination of the individual sockets on a duplex outlet being actively used allowing for individual devices within a building to be monitored. The information from the algorithm on each device in use at each monitor can be transmitted over the network to a human operator.

Given the density of electrical outlets in commercial buildings, and high activity facilities in particular, and the inclusion of a wireless transceiver (205) and antenna (215) within the monitor, the monitor (200) can also serve as a ground-truth node in an asset tracking system and the network of all such interconnected monitors (200) will generally provide good coverage given current building codes. As asset tracking generally utilizes a wireless network and measurement of returned signal strength, bit error rate, and other characteristics one skilled in the art of network design may typically measure within a connected network. In one such example, the returned signal strength measured between a singular installed monitor (200) and other, stationary monitors, will establish a default state of the network. When a mobile wireless device (101), or fiducial element, that is a part of the network approaches the ground truth device, this will change this measurement and the relationships between the existing monitors (200), thus allowing for tracking to occur within the network based upon these changes. Each monitor (200) containing a transceiver (205) may be referred to as a node in the network for both networking and asset tracking purposes.

The transceiver (205) within the device may be placed such that it is close to, but not necessarily exposed by, the front of the faceplate (201) and face outward into the environment in which the electrical outlet is found. The different data collected by the invention are accessed through an external interface which makes available the electrical power consumption, other environmental sensor data, and asset tracking information.

By providing a monitor (200) with design affordances that allow for installation in standard electrical outlets and for structure and means for both measuring power consumption and environmental conditions at an electrical receptacle and for reporting such information to the network of connected devices, the system allows for a much easier installation of connectivity in a commercial setting. The wireless protocol intended for use by the device typically is Bluetooth® on the 2.4 GHz band; however, such protocol is not required.

A monitor (200) may connect with other monitors (200) assigned to the same network through a mesh-type network structure in which each node of the network has the ability to send data or receive data from any other node within the network through a communication method known to each monitor (200). A network identifier (ID) may be instantiated on each monitor (200) during the first power-on procedure as a step of the installation. A monitor (200) being added to an existing network may require the appropriate network ID and security credentials, thus making a network of these monitors (200) a secure local network.

Figure 6:
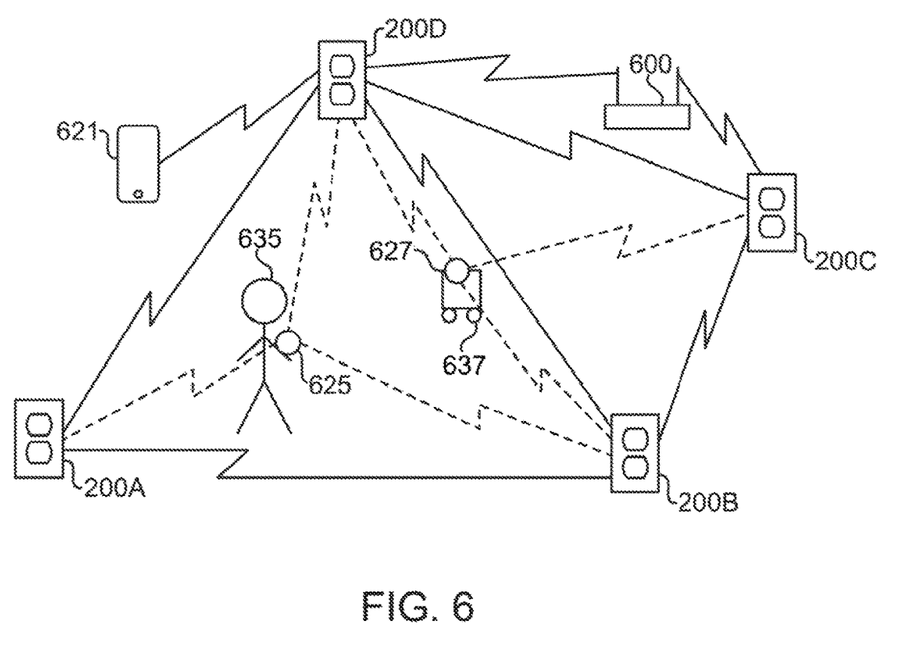
FIG. 6 shows an embodiment of multiple faceplate monitors installed and being used in a variety of tracking and recording activities.

Such a local network may be connected to a central computer server (600) as shown in FIG. 6. The local network may require an appropriate query and encrypted password in order to transmit data to a global network depending on the security needs of the end user. Upon access to the local network by the global network, monitors (200) may be queried for historical and current information depending on the nature of the query. The central computer server (600) could then display this data as would be appropriate to one skilled in the art of virtual dashboard and interface design.

As part of being a wireless network is the ability for each monitor (200) within the network to act as a ground-truth element in an asset tracking system in which mobile fiducial elements detectable by the network, could be tracked spatially by comparing the changes in signal characteristics, such as received signal strength or bit error rate, over time. Increased density in ground truth nodes generally means finer resolution of the location of the asset being tracked, and natural redundancy in the system helps to provide quality location information. The present network can further extend such capabilities by allowing the system to operate based upon the sharing of collected data, wherein each monitor (200) within the asset tracking system is primarily acting to share its data with the network whereby the sharing of such data allows the network to use standard networking characteristics to determine the location of motile/mobile nodes within that network.

Further, the density at which electrical outlets can be found within a facility is within the tolerance for effective node placement in an asset tracking system, thus the monitors (200) combine asset tracking and power monitoring into a single package to be installed in electrical outlets. To address the invasiveness of installation, a specialized installation structure allows for non-contact electrical current measurement and protected-contact device power distribution during installation procedure, thus providing no safety reasons for main electrical power disruption in the facility.

Non-contact electrical current measurement is achieved by special placement of a compass or magnetometer (207) which can detect the induced magnetic field which is generated when a power-drawing load is connected to an electrical outlet. Such magnetic fields, by methods one skilled in the art of signal processing would be aware of, can be used to infer certain information regarding the load, including power consumption and the specific socket of an outlet to which the load is attached. This information allows a human operator to access load-level data about power consumption within the facility. The principal vectors of the magnetic field, which can be determined from such processing, embed information about the power consumption of the load(s) powered from the outlet. This information may be decoded by intelligent inference through an algorithm implemented on a computer processor (203) included in the monitor (200).

Within the generally flat front of the faceplate (201), a multitude of small environmental sensors (217) may be embedded in order to measure information about the space in which the monitor (200) is installed. These include but are not limited to ambient light, ambient noise, temperature, and humidity. The sensors (217) will record events which occur in the environment within a certain radius of the monitor (200) as a function of the sensor (217) specification. The data that is created by these sensors (217) may then be transmitted along the network, queried by the central computer (600), an/or recorded within each monitor (200) on on-board memory for some period of time. In order to store the data in a way that is efficient and would not require significant power draw from the monitor (200), certain summary metrics and packet design may be utilized to encapsulate environmental data within a smaller number of bits. These summary metrics would typically be unpacked by the central computer (600) upon query.

Figure 2:
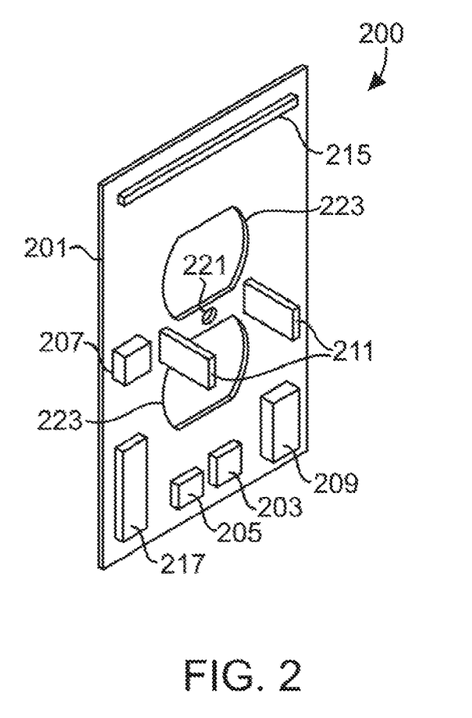
FIG. 2 provides an illustration of an embodiment of an integrated monitor in the form of an electrical faceplate and including block elements of the components.

Examining more closely the low profile monitor (200) meant for installation as a faceplate (201) as shown in FIG. 2, such a device generally comprises a computer (203), transceiver (205), magnetic field measuring system (207) as previously discussed, and some source of power (209). Depending on the embodiment, the power source (209) may comprise an on-board direct power source such as a battery, may comprise a power converter for converting alternating current (AC) to direct current (DC) power, or for altering characteristics of the power, or may comprise a combination of both. In the embodiment of FIG. 2, the monitor (200) connects to the AC power system within the facility through the use of two conducting prongs (211) and an adapter (209). The prongs or protrusions (211) are positioned so as to contact the wire connecting location in the outlet that the faceplate (201) is attached to and therefore draw power from the same source as is provided for objects which are plugged into the outlet.

Connecting to the main building power supply is generally a preferred methodology as it allows for the monitor (200) to have access to power without the need to change batteries or otherwise have concerns that the monitor (200) may require maintenance or suffer unexpected downtime. A problem, however, with utilizing the buildings AC power network, however, can be installation. Because of the hazardous nature of AC electricity, in order to connect to internal AC wiring (such as when replacing an outlet), it is generally necessary to shut off power to the outlet. As was discussed above, in many types of high activity facilities, particularly in the healthcare field, this may not be possible. Thus, the monitor (200) may be provided with alternative connection mechanisms which allow the faceplate (201) to be installed to the outlet without shutting off electricity to the outlet. Two of these alternatives are shown in FIGS. 3 and 4.

Figure 3:
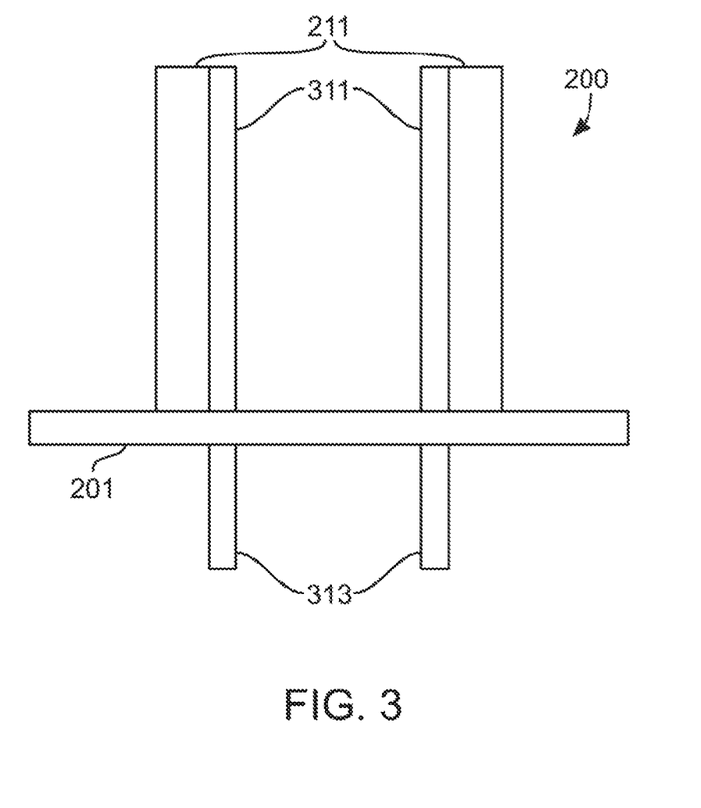
FIG. 3 provides an illustration of an embodiment of a connector to provide interaction between conductive protrusions of the faceplate and main electrical power terminals on an outlet after installation. The embodiment of FIG. 3 utilizes an insulating removable shield.
Figure 4:
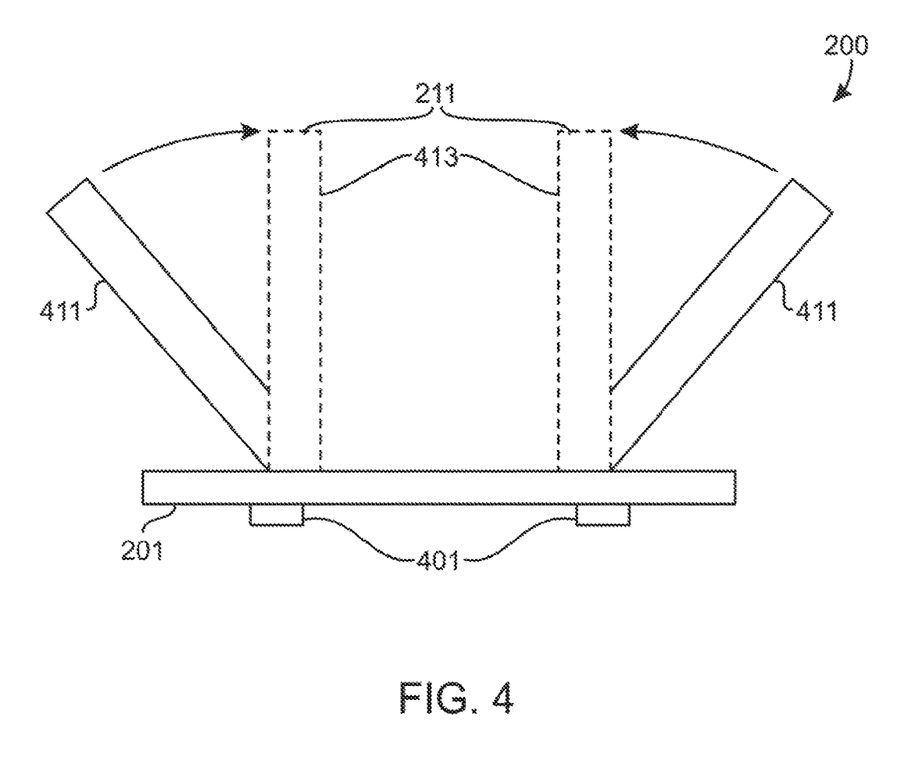
FIG. 4 provides an illustration of an alternative embodiment of a connector to provide interaction between conductive protrusions of the faceplate and main electrical power terminals on an outlet after installation. The embodiment of FIG. 4 utilizes moveable conducting elements.

In the embodiment of FIG. 3 the two electrically conductive protrusions (211) are initially at least partially covered with an electrically insulated cover (311). In the embodiment of FIG. 3, the cover (311) is simply provided on the inside of each protrusion (211) as this will be the portion that will contact the live wiring. In order to install the monitor (200), the original faceplate cover of the outlet will be removed and the present faceplate (201) will be positioned to replace it with the outlets positioned in holes (223) with the insulated covers (311) in place. Once positioned, the faceplate (201) will be screwed onto the outlet in the manner of a traditional faceplate utilizing the screw hole (221). At this time, the insulated cover (311) is between each protrusion (211) and the live electrical connection to the main building power supply. The insulated cover (311) will typically be in physical contact with the connection point.

Following installation of the faceplate (201) onto the receptacle, the insulated cover (311) will be removed externally to the faceplate (201) in such a way that the electrically conductive protrusions (211) contact the main building power supply. In FIG. 3, the insulated cover (311) extends from on the faceplate (201) forming two pull tabs (313). The user can grasp the pull tabs (313) and pull which will cause the insulated covers (311) to pull loose from between the protrusions (211) and electrical outlet and be pulled through the front of the faceplate (201).

As soon as the covers (311) are removed, the protrusions (211) are in electrical contact with the building's power system. The removal is safe for the user as the user is always grasping the tabs (313) which are insulated and therefore they can never conduct electricity from the building power grid to the user. Thus, while it is still safer to install the faceplate (201) when the power is shut off to avoid any inadvertent contact with live electrical systems, the monitor (200) can be installed when power is flowing into the outlet the faceplate (201) is to be attached to.

Upon the establishment of contact between the electrically conductive protrusions (211) and the main building power supply, electrical power would be supplied to appropriate power conversion technology (209) and can be supplied to the computer (203), transceiver (205), and any other electronics within the faceplate (201) requiring power.

If the faceplate (201) would need to be removed later on, that can also generally be done safely as the faceplate (201) material will generally also be insulated or at least include electrical isolation or non-conductive structure to isolate the user from the electrically conductive portions. To uninstall, the user can simply unscrew the faceplate (201) from the receptacle, grasp, and pull it out. This breaks the electrical connection as the prongs clear the receptacle and is akin to unplugging a standard cord from an outlet in many respects.

FIG. 4 provides for an alternative connecting mechanism for the protrusions (211). In FIG. 4, the protrusions (211) are initially positioned in a non-contact position (411) where they will not contact live electrical wires when installed. The face plate (201) will be installed in the same manner as discussed above. Once installed, the position of the protrusions (211) are adjustable through a manipulation structure (401) on the front of the faceplate (201). Following the initial installation of the faceplate (201), the protrusions (211) are not initially in contact with the main building power supply as they are still in non-contact position (411). However, the manipulation structure (401) may be manipulated by the user (e.g. by rotating pressing or otherwise manipulating it) which will cause the protrusions (211) to change position as indicated by the arrows until such time as said protrusions (211) are electrically connected to the main building power supply by being in contact position (413). Once in position (413), electrical power would be supplied to appropriate power conversion technology (209) as required to power the computer (203), transceiver (205), and other associated electronics within the faceplate (201) as contemplated above.

In the embodiment of FIG. 4, the manipulation structure (401) may be designed to allow only a single one-way movement (e.g. from the position (411) to the position (413)) or may be designed to allow for the positioning to be reversed as well (e.g. from position (413) to position (411))

depending on embodiment. To remove the faceplate (201) of FIG. 4, the manipulation structure (401) may first be adjusted to disconnect the electrical connection and then the faceplate (201) removed, or the faceplate (201) may simply be pulled out with the prongs (211) remaining in position (411) as discussed in conjunction with FIG. 3.

As the faceplate (201) is attached to an electrical outlet, it can be provided with capability to measure current passing through the outlet and therefore being consumed by devices attached to the outlet. In the embodiment of FIG. 2, the faceplate (201) is provided with a system for measuring the magnetic fields (207) associated with the outlet and communicating that information to the computer (203) in the monitor (200). The computer (203) uses the reported magnetic field information to calculate the electrical current flowing through the outlet, and further calculating which socket on a multi-socket outlet that said electrical current is flowing through. Information regarding the flow of current through the outlet and the magnetic field is generally stored by the computer (203) on on-board memory until such time as said information is requested by an external computer server (600), at which time the information would be transmitted to the network or computer server (600) as required for the operation of the network. While it is preferred that the monitor (200) include an on-board computer (203) for performing the calculations, it is not strictly necessary and in an alternative embodiment, raw data from the magnetic field sensor (207) may be stored and/or transmitted.

Figure 5:
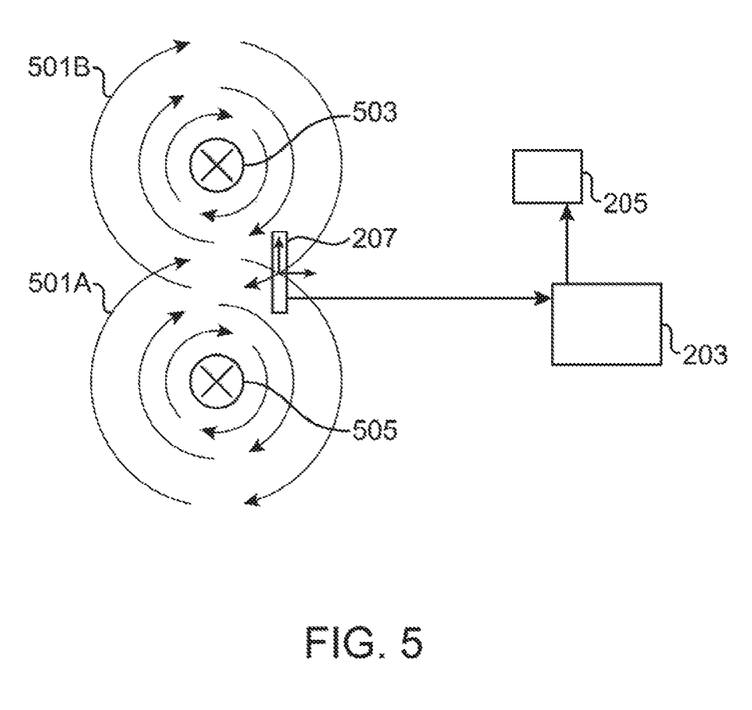
FIG. 5 provides an illustration of an embodiment of how magnetic fields from the various outlet connections can be measured and the information transmitted.

To measure the consumption of an attached device, the magnetic field sensor (203) collects information about the magnetic field near the outlet which consists of field (501A) and (501B) strength and direction induced by electrical flow from each individual socket, relays that information to the computer (203) wherein the computer (203) interprets said magnetic fields to infer some amount of current flowing through the system as depicted in FIG. 5. The computer (203) is generally capable of inferring through which socket within an outlet said current is flowing through due to differences in orientation of the fields (501A) and (501B) at the magnetometer (207) as illustrated in FIG. 5, allowing the system to provide individual outlet level information regarding current flowing within the monitor (200). Such granular information provides an accurate representation of power being drawn through a given individual socket, and may be useful information for building managers regarding energy consumption within a given facility. So long as a person is aware of what device is plugged into which individual socket, the power consumption of that individual device can be inferred from the monitor (200).

Inference of electrical draw by the computer (203) is generally done through an algorithm which processes raw signal from the magnetic field sensor (207). Such an algorithm will preferably turn a raw magnetic field measurement into a vectorized form. This vectorized form will generally be classified through phase characteristics to determine whether the top socket (503), bottom socket (505), or both sockets (503) and (505) are in active use. This classification is then coupled with the vectorized signal. This coupled data can then be further characterized by its magnitude to determine raw power consumption, directly related to magnetic field through classical scientific relationships. The raw signal, this measurement, in addition to the individual socket characterization, may then be transmitted over the network using the transceiver (205) and antenna (215) to a central computer (600) for access or further processing by an external user.

Each monitor (200) may additionally comprise an environmental sensor (217), wherein an environmental sensor can be any device or combination of devices which measures an aspect of an area surrounding the sensor (217) and reports the information from such measurement in a useful way. Environmental sensors (217) include but are not limited to those which detect light level, temperature, humidity, and sound. The environmental sensor (217) may be used to provide additional information about the facility where said monitor (200) is installed. The information collected by said environmental sensor (217) is generally also communicated with the computer (203) within the monitor (200). The computer (203) may process the data and/or transmit the data to the network and/or to external computer server (600) as desired. The computer (203) may also utilize environmental sensor (217) data to operate or modify certain aspects of the monitor (200) as well.

The collection of information comprising data from the current sensing element (207) as well as any environmental sensors (217) present may be transmitted to the network as required by external information requests or as required for internal function of the network. Such transmissions of information establish wireless connections between each monitor (200), wherein such wireless connections will produce properties about the communications, as one skilled in the art of wireless communication systems would be aware. The network systems onboard the monitor (200) may also be installed/carried by a mobile entity (101) and that can allow the monitor (200) to both communicate with and locate a mobile entity (101) it is in communication with. As the mobile entity (101) location would be updated essentially continuously, this also provides the potential to create a map of such mobile entities (101) within the communication network as described herein. It would further be possible to use such a system to perform detection of objects without transceivers if they also exist within the network.

FIG. 6 provides a preferred embodiment of how network communication and asset tracking may be performed in an embodiment of a network in a facility utilizing the faceplate mounted monitors (200). In this, the network comprises two or more monitors (200) mounted to two different outlets and acting as beacons (200A), (200B), (200C) and (22D). Each of the monitors (200) can be of the form of FIG. 2 and comprise a computer (203), transceiver (205), an optional environmental sensing element (217), and a means of electrically contacting the main power from which to power its electronics such as protrusions (211) and adapter (209). The monitor (200) may include one or more of the following: the magnetic current sensing technology (207) as described herein, light level, temperature, humidity, and sound. Each monitor (200) is capable of communicating with one another utilizing standard networking protocols, but in a preferred embodiment generally takes the networking topology traditionally described as a mesh network.

The monitors (200), in addition to being in communication with each other, are preferably further capable of communicating with non-installed computer devices such as smartphone (621) or with central control computers (600). These computer devices (621) and (600) may receive environmental data from the monitors (200) and the wireless communication properties calculated between said computer devices (621) and (600) and said monitors (200). This can provide for information feedback as well as remote control. Further, tracking devices (625) and (627) may be provided on personnel (635) and assets (637) respectively which can also communicate with the faceplates (201) during normal network operations. This communication will typically provide enough information due to interaction with the monitor (200) for the computer devices (621) and (600) and/or trackers (625) and (627) to be geographically located with respect to the monitors (200) if they are within the network coverage area and their location is desired.

Still further, as the tracker (627) may be attached to an asset (637) which may utilize electricity, the asset (637) may be plugged into a power outlet associated with a particular monitor (200B). As the location of the asset (637) is known, and the monitor (200B) through the sensor (207) can determine that electricity is being drawn from the associated outlet, the electrical use from the monitor (200A) may be inferred to be being caused by asset (637) and attributed to it.

As indicated above, there is provided herein, in an embodiment, a slim-profile/unobtrusive wireless electrical current monitor which is capable of determining the overall electrical current for each socket in an outlet without conflict, which is capable of wireless communication and networking between two or more computers on the network where each monitor comprises: a transceiver for communication, and a computing element for performing calculations; wherein each monitor sends signals to one or more other computers on the network where the signal includes a unique identifier of the computer sending the signal; where each individual monitor processes and transmits on the network information collected at installation location.

In an embodiment of the monitor, environmental sensors are embedded within the monitor. Environmental sensors may include but are not limited to humidity, temperature, light, radiation, tactile, or particulate and/or data from environmental sensors may be overlaid on a map for purposes of data visualization.

In an embodiment of the monitor, the carrier frequency of the wireless communication channels is within the range from 850 MHz and 17.5 GHz inclusive.

In an embodiment of the monitor location of a network object within the network can be determined using one more of RSSI, bit error rate, or latency values between network objects.

In an embodiment of the monitor maps of current, location, and environmental measurements would be created for location based visualization on an external interface that is associated with the network through an encryption protocol.

In an embodiment of the monitor, the monitor is in the form of the design such that it fits over but does not inhibit using an electrical outlet to replace a traditional outlet faceplate.

In an embodiment, the monitor is powered appropriate power electronics and electrical connections which interface directly with the electrical outlet on which the system is installed and which can be insulated from the electrical outlet for installation procedure. The monitor may additionally or alternatively be powered by an onboard battery or by utilizing of appropriate systems to harvest energy including, but not limited to, solar cells, piezoelectrics, or thermoelectrics.

In an embodiment the monitor measures current electric draw by measuring induced magnetic fields.

There is also provided herein a network of two or more nodes wherein each node provides current monitoring, environmental monitoring, and wireless ground truth information and where new nodes for the network are easily added.

In an embodiment of the network, the nodes are easily installed within existing infrastructure and each node may be in the form of a replacement faceplate for a traditional electrical outlet.

In an embodiment, the network provides information to external systems known to the network through an encryption protocol.

In an embodiment, the network provides one or more of RSSI, bit error rate, latency for communication between nodes of the network.

In an embodiment of the network, the carrier frequency between nodes is 850 MHz to 17.5 GHz inclusive.

In an embodiment of the network, environmental sensors are also included in each node. These environmental sensors may include but are not limited to one or more of ambient light, temperature, humidity, radiation, particulate, or tactile. Environmental sensor data may also be overlaid on a map for visualization.

In an embodiment of the network, data may be visualized on an external system known to the network through an encryption protocol.

In an embodiment of the network, a new node may be added to the network by advertising their presence followed by authorized user acceptance to add them to the network.

In an embodiment of the network any or all nodes may be powered by battery, energy harvesting systems, and/or by electrical contact and appropriate power electronics.

In an embodiment, the system compensates for the wiring between the power outlets, and/or determines the current draw from each specific outlet. Provided a set of outlets, at least some of which are wired in parallel, the current through an individual socket may be determined by comparing the current readings from other power outlets in the circuit over time.

FIGS. 7-9 depict the relationship of electrical current readings among four receptacles wired in parallel. The left-most depicted outlet is the first receptacle in the circuit, the right-most outlet is the last, and the rest are middle outlets. FIG. 8 depicts a system in which current readings are made on four outlets wired in parallel with two loads, the left-most outlet being the first in the circuit. FIG. 9 depicts a system in which current readings are made on four outlets wired in parallel with three loads, the left-most outlet being the first in the circuit.

Particularly in residential settings such as households, common wiring methods include multiple circuits which often contain multiple outlets in parallel. In such wiring configurations, electrical current flows within a circuit to each outlet receptacle from a central main circuit panel. Typical circuits in households may contain six or more outlets in parallel. Outlets that are not the first or the last in the circuit are referred to in the art as middle outlets. Modern building code generally requires that certain large appliances have their own, separate circuit. However, most other circuits have multiple outlets.

In an embodiment, the system may determine the hierarchy within a set of outlets wired in parallel as well as which circuit they belong to within the building. This may be achieved by sending a signal down the power lines or comparing the current readings at each outlet over time.

In an embodiment, the information provided by the system may be used for generating a representation of the wiring in the building.

In an embodiment, the system can determine the hierarchy within a set of outlets based on the slight differences in current readings through a circuit with outlets in parallel due to the resistance in the wires between each outlet.

In an embodiment, the system may use an inline circuit which may be used to send a signal through the power lines to determine the hierarchy within a set of outlets wired in parallel.

In an embodiment the system may use an inline circuit for configuration purposes.

While the invention has been disclosed in conjunction with a description of certain embodiments, including those that are currently believed to be preferred embodiments, the detailed description is intended to be illustrative and should not be understood to limit the scope of the present disclosure. As would be understood by one of ordinary skill in the art, embodiments other than those described in detail herein are encompassed by the present invention. Modifications and variations of the described embodiments may be made without departing from the spirit and scope of the invention.

The invention claimed is:

1. A monitor device of a wireless networking monitoring system comprising:
   a faceplate having an outside surface and an opposing inside surface, and configured to install on an electrical outlet to replace a standard faceplate used to hide a hole that said electrical outlet makes in a wall, said electrical outlet having a plurality of terminal posts interconnecting a socket in said outlet to an energized electrical circuit, said socket configured to interconnect with a plug of a device to be powered from said energized electrical circuit;
   a computer attached to said inside surface;
   an antenna attached to said inside surface;
   a transceiver coupled to said antenna and operatively coupled to said computer and configured to transmit and receive via said antenna; and
   a plurality of electrically conductive protrusions attached to said inside surface, said plurality of electrically conductive protrusions sized and shaped, and positioned on said surface, to contact and draw power from contacting said plurality of terminal posts when said faceplate is installed thereon, said electrically conductive protrusions providing said drawn power to said computer and to said transceiver.

2. The monitor device of claim 1, further comprising:
   a magnetic field sensor attached to said inside surface, said magnetic field sensor disposed on said inside surface at a location configured to detect and measure magnetic fields.

3. The monitor device of claim 2, wherein said magnetic field sensor is configured to measure current passing through said outlet to said device.

4. The monitor device of claim 3, wherein said magnetic field sensor is coupled to said computer and said computer is configured to receive from said magnetic field sensor said measurements of said current passing through said outlet to said device.

5. The monitor device of claim 4, wherein said outlet comprises a plurality of sockets, and said computer is further configured to determine which of said plurality of sockets electrical current is flowing through to said device.

6. The monitor device of claim 2, wherein said magnetic field sensor is selected from a group consisting of: compass; magnetometer; search coil; flux-gate; optically pumped; nuclear precession; superconducting quantum interference device (SQUID); Hall-effect; magnetoresistive; magnetodiode; magnetotransistor; fiber optic; and magnetooptic.

7. The monitor device of claim 1, wherein said transceiver is configured to transmit and receive via an encrypted protocol.

8. The monitor device of claim 1, wherein said transceiver is configured to transmit at a carrier frequency of between 850 MHz to 17.5 GHz, inclusive.

9. A network monitoring system comprising:
   a first outlet having a plurality of terminal posts;
   a first monitor device installed on said first outlet and comprising:
      a faceplate having an outside surface and an opposing inside surface;
      a computer attached to said inside surface;
      an antenna attached to said inside surface;
      a transceiver coupled to said antenna and operatively coupled to said computer and configured to transmit and receive via said antenna;
      a plurality of electrically conductive protrusions attached to said inside surface, said plurality of electrically conductive protrusions sized and shaped, and positioned on said surface, to contact and draw power from said plurality terminal posts when said faceplate is installed thereon, said plurality of electrically conductive protrusions providing said drawn power to said computer and to said transceiver; and
      a magnetic field sensor attached to said inside surface, said magnetic field sensor disposed on said inside surface at a location configured to detect and measure magnetic fields related to current passing through said outlet;
   a central computer server in wireless communication with said first monitor device via said transceiver;
   a second outlet having a plurality of terminal posts;
   a second monitor device installed on said second outlet and comprising:
      a faceplate having an outside surface and an opposing inside surface;
      a computer attached to said inside surface;
      an antenna attached to said inside surface;
      a transceiver coupled to said antenna and operatively coupled to said computer and configured to transmit and receive via said antenna;
      a plurality of electrically conductive protrusions attached to said inside surface, said plurality of electrically conductive protrusions sized and shaped, and positioned on said surface, to contact and draw power from said plurality of terminal posts of said second outlet when said faceplate is installed thereon, said plurality of electrically conductive protrusions providing said drawn power to said computer and to said wireless transceiver; and
      a magnetic field sensor attached to said inside surface, said magnetic field sensor disposed on said inside surface at a location configured to detect and measure magnetic fields related to current passing through said outlet;
   wherein said first monitor device computer is configured to transmit to said central computer server said measurements of said current passing through said first outlet received at said first monitor device from said magnetic field sensor;
   wherein said second monitor device computer is configured to transmit to said central computer server said measurements of said current passing through said second outlet received at said second monitor device from said second monitor device magnetic field sensor;
   wherein said first outlet and said second outlet are wired in parallel so that the power draw from said first outlet includes power draw from said second outlet; and
   wherein said first monitor device computer can determine based on said power draw from said second outlet at said first outlet, that said first outlet and said second outlet are wired in parallel.

* * * * *